(12) United States Patent
Thomas

(10) Patent No.: US 10,797,695 B2
(45) Date of Patent: Oct. 6, 2020

(54) CURRENT SUBTRACTION CIRCUITRY

(71) Applicant: SEMICONDUCTOR COMPONENTS INDUSTRIES, LLC, Phoenix, AZ (US)

(72) Inventor: Kyle Thomas, San Francisco, CA (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 15/955,379

(22) Filed: Apr. 17, 2018

(65) Prior Publication Data
US 2019/0319619 A1 Oct. 17, 2019

(51) Int. Cl.
| H03K 17/945 | (2006.01) |
| G05F 3/26 | (2006.01) |
| G01B 7/02 | (2006.01) |
| H03F 3/45 | (2006.01) |
| H03K 5/02 | (2006.01) |

(52) U.S. Cl.
CPC ........... *H03K 17/945* (2013.01); *G01B 7/023* (2013.01); *G05F 3/262* (2013.01); *H03F 3/45071* (2013.01); *H03K 5/023* (2013.01)

(58) Field of Classification Search
CPC .............................. G05F 3/262; H03K 17/945
See application file for complete search history.

(56) References Cited

U.S. PATENT DOCUMENTS

| 4,055,812 A * | 10/1977 | Rosenthal ........... H03F 3/45071 330/253 |
| 4,748,652 A | 5/1988 | Nagai |
| 4,800,303 A * | 1/1989 | Graham ......... H03K 19/018535 326/30 |
| 5,729,178 A | 3/1998 | Park |
| 7,463,013 B2 | 12/2008 | Plojhar |
| 9,642,215 B2 * | 5/2017 | Verma ....................... G01D 5/30 |

OTHER PUBLICATIONS

Lin et al. "A Precise Current Subtractor Design." 2011 International Conference on Circuits, System and Simulation, IPCSIT vol. 7 (2011).

* cited by examiner

*Primary Examiner* — Lincoln D Donovan
*Assistant Examiner* — Colleen J O Toole
(74) *Attorney, Agent, or Firm* — Treyz Law Group, P.C.; Jason Tsai

(57) ABSTRACT

An electronic device may include a sensing circuit and a current subtraction circuit. The sensing circuit may output first and second current signals. The current subtraction circuit may mirror the first and second current signals onto first and second current branches. The second current branch may be split into a first sub-path and a second sub-path. An amplifier may control the amount of current flowing through the second sub-path by forcing the current flowing through the first current branch and the current flowing through the first sub-path to be identical. Configured in this way, the current flowing through the second sub-path will be equal to the difference between the first and second current signals. The current flowing through the second sub-path may be optionally amplified using another current mirror.

14 Claims, 5 Drawing Sheets

CURRENT SUBTRACTION CIRCUITRY

BACKGROUND

This relates generally to electronic devices, and more particularly, to electronic devices configured to subtract signals.

Electronic devices such as cellular telephones, cameras, and computers sometimes include proximity sensors for detecting the distance between the electronic device and an external object. A proximity sensor typically includes an infrared light source and a photodiode that records a first measurement when the infrared light source is on and a second measurement when the infrared light source is off. The first and second measurements are converted to digital signals and then subtracted to compute the difference. The proximity sensor output will be based on the magnitude of the computed difference. Performing subtraction in the digital domain may, however, suffer from latency and accuracy issues.

It is within this context that the embodiments herein arise.

DETAILED DESCRIPTION

Embodiments of the present invention relate to electronic devices with current subtraction circuitry. It will be recognized by one skilled in the art that the present exemplary embodiments may be practiced without some or all of these specific details. In other instances, well-known operations have not been described in detail in order not to unnecessarily obscure the present embodiments.

Figure 1:
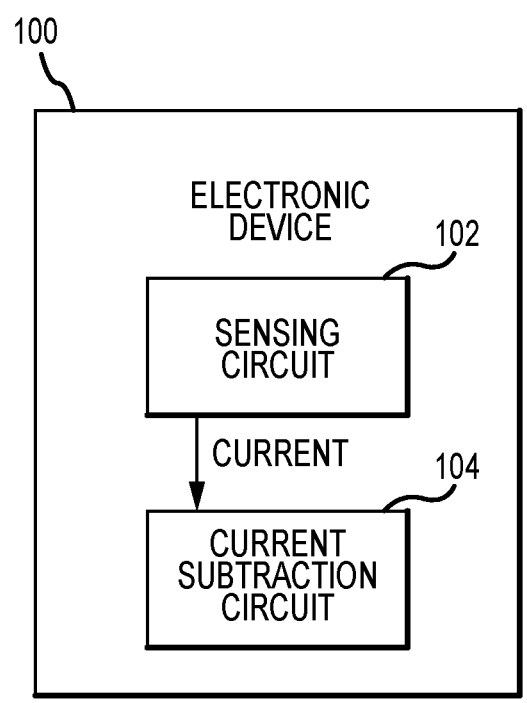
FIG. 1 is a diagram of an illustrative electronic device having a current subtraction circuit in accordance with an embodiment.

Electronic devices such as digital cameras, computers, cellular telephones, and other electronic devices may include sensors for capturing signals and may further include processing circuitry for subtracting the captured signals. FIG. 1 is a diagram of an electronic device such as electronic device 100 that may include a sensing circuit 102 and a current subtraction circuit 104. As shown in FIG. 1, sensing circuit 102 can be any type of sensing component including but not limited to: a light sensing circuit, an audio sensing circuit, a motion sensing circuit, a pressure sensing circuit, and/or other suitable types of sensing circuit.

Sensing circuit 102 may output current signals (i.e., signals in the current domain rather than the voltage domain). For example, sensing circuit 102 may output a first current signal I_a and a second current signal I_b. Current subtraction circuit 104 may receive the current signals from sensing circuit 102 and may be configured to compute the difference of the received current signals (e.g., circuit 104 may be configured to compute I_a minus I_b).

Figure 2A:
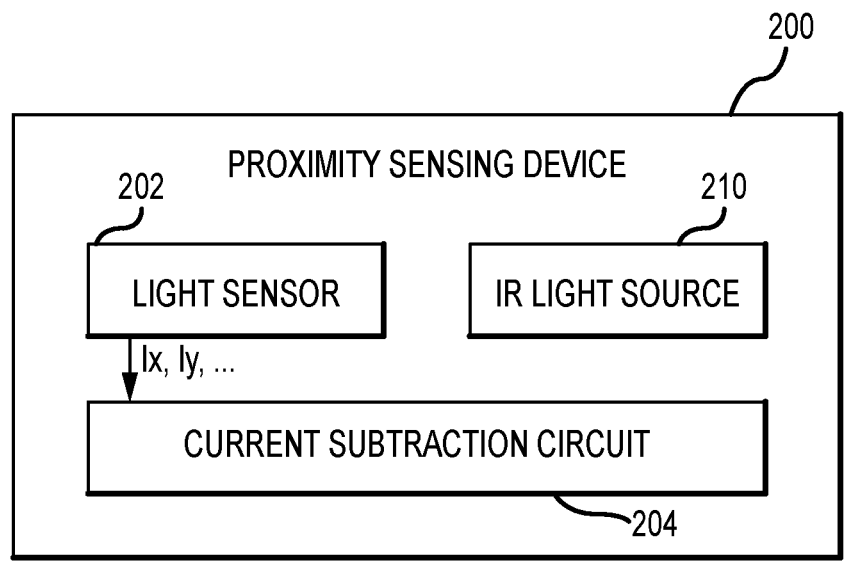
FIG. 2A is a diagram of an illustrative proximity sensing device having a current subtraction circuit in accordance with an embodiment.

FIG. 2A is a diagram of an illustrative proximity sensing device 200 that may include a current subtraction circuit. As shown in FIG. 2A, proximity sensing device 200 may include a light sensor 202, an infrared light source 210, and a current subtraction circuit 204. The structure and function of current subtraction circuit 204 in FIG. 2A may be similar or identical to that of current subtraction circuit 104 in FIG. 1. Light sensor 202 may include one or more photosensitive elements (e.g., one or more photodiodes). Infrared light source 210 can be pulsed on and off. When light source 210 is pulsed on, light sensor 202 may output a first current measurement Ix, which represents the amount of ambient light plus any additional reflection caused by the infrared light source. When light source 210 is pulsed off, light sensor 202 may output a second current measurement Iy, which represents only the amount of ambient light. Subtraction circuit 204 may receive the current measurements Ix and Iy from sensor 202 and may directly compute a difference [Ix−Iy] in the analog domain (i.e., subtraction circuit 204 outputs the difference amount also as a current). Device configurations in which a current subtraction circuit is used in a proximity sensor may sometimes be described herein as an example. This is, however, merely illustrative.

Figure 2B:
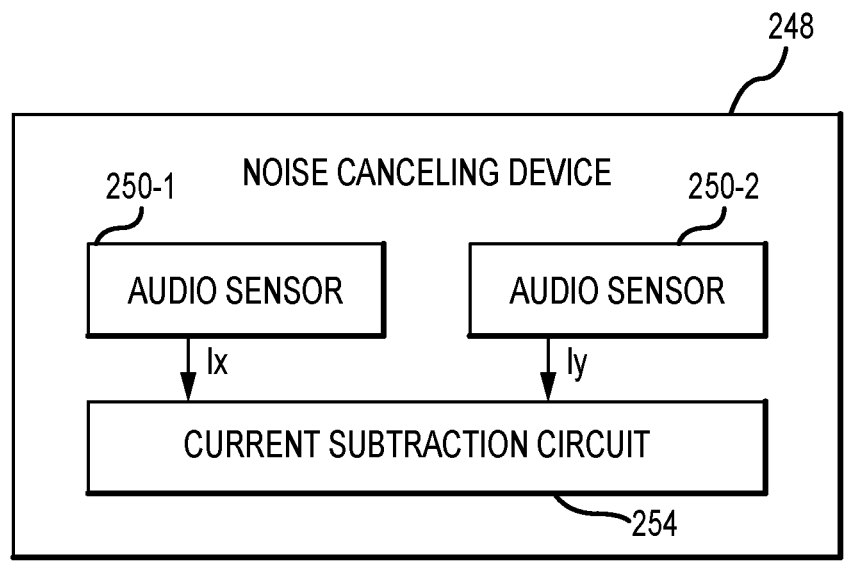
FIG. 2B is a diagram of an illustrative noise cancelling device having a current subtraction circuit in accordance with an embodiment.

FIG. 2B is a diagram of an illustrative noise cancelling device 248 that may also include a current subtraction circuit. As shown in FIG. 2B, noise cancelling device 248 may include a first audio sensor 250-1, a second audio sensor 250-2, and a current subtraction circuit 254. The structure and function of current subtraction circuit 254 in FIG. 2B may be similar or identical to that of current subtraction circuit 104 in FIG. 1. First audio sensor 250-1 may be configured to measure a first amount of audio signals to generate a first corresponding current output Ix, whereas second audio sensor 250-2 may be configured to measure a second amount of audio signals to generate a second corresponding current output Iy. Subtraction circuit 254 may receive the current measurements Ix and Iy from sensors 250-1 and 250-2, respectively, and may directly compute a difference [Ix−Iy] in the analog domain (i.e., subtraction circuit 254 outputs the difference amount also as a current). The example of FIG. 2B in which noise cancelling device 248 uses two separate audio sensors to achieve noise canceling is merely illustrative. If desired, noise cancelling may be performed using only one audio sensor configured to output multiple current signals for subtraction by circuit 254.

The examples of FIGS. 2A and 2B in which a proximity sensing device and a noise cancelling device use current subtraction circuitry to perform subtraction in current mode are merely illustrative. In general, current subtraction circuitry may be included in any type of sensing devices that need to subtract measured signals.

Figure 3:
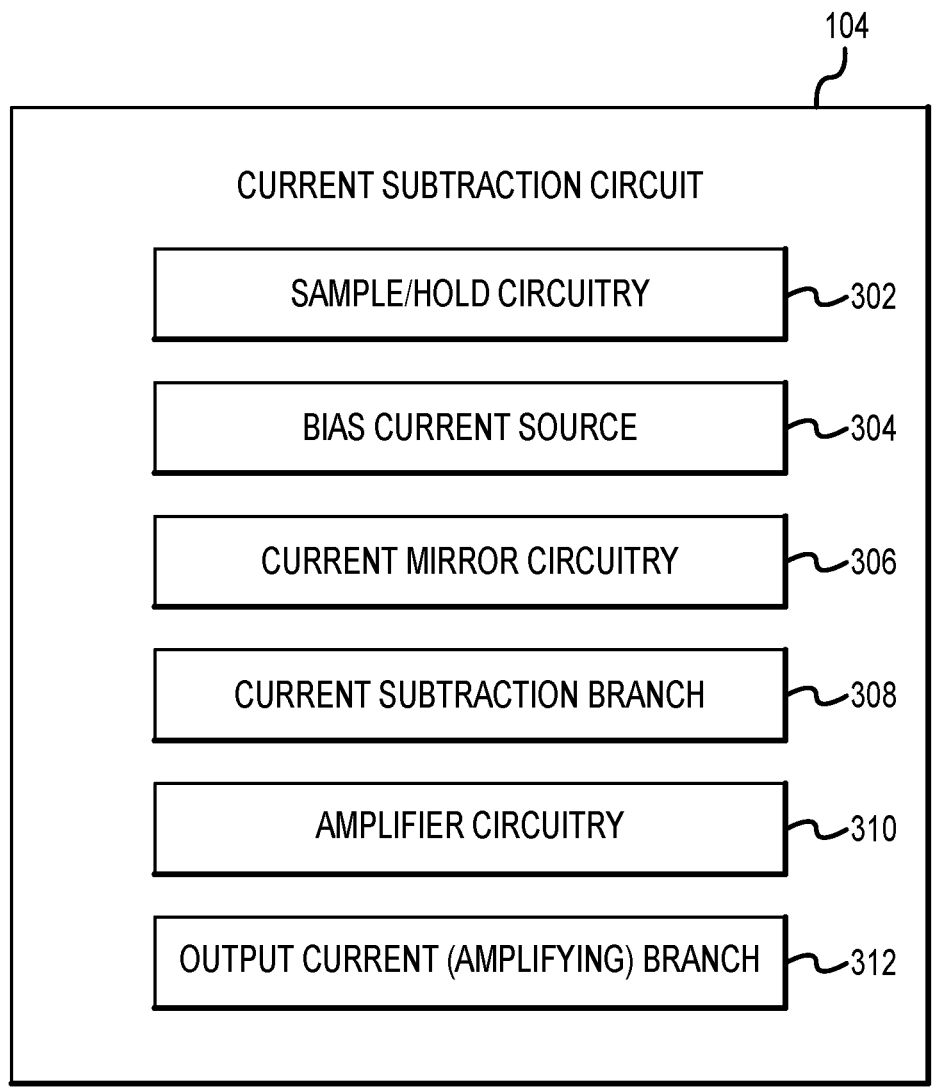
FIG. 3 is a block diagram of an illustrative current subtraction circuit in accordance with an embodiment.

FIG. 3 is a block diagram of current subtraction circuit 104. As shown in FIG. 3, current subtraction circuit 104 may include sample-and-hold circuitry 302, a bias current source 304, current mirror circuitry 306, a current subtraction branch 308, amplifier circuitry 310, and an output current branch 312. Sample-and-hold circuitry 302 may be configured to sample any measured current signals and to temporarily hold the values of the measured signals until the subtraction is complete. Sometimes, the measured signals may be very small, which can be difficult to sense. Bias current source 304 provides additional current, which is added directly to the measured current signals and can help with subsequent current mirroring operations (described below).

Current mirror circuitry 306 is configured to mirror a first sampled current to a first current branch and to mirror a second sampled current to a second current branch. The second current branch then splits into a first sub-branch and a second sub-branch. Amplifier circuitry 310 may be configured to ensure that the currents flowing through the first current branch and the first sub-branch are identical. As a result, the current flowing through the second sub-branch will be equal to the desired current difference (i.e., the amount of current flowing through the second sub-branch will be equal to the difference between the first and second sampled currents). The current flowing through the second sub-branch may be mirrored to output current branch 312 with an optional current amplification. The current amplification can be achieved by sizing up the current mirroring transistor relative to that of the second sub-branch.

Figure 4:
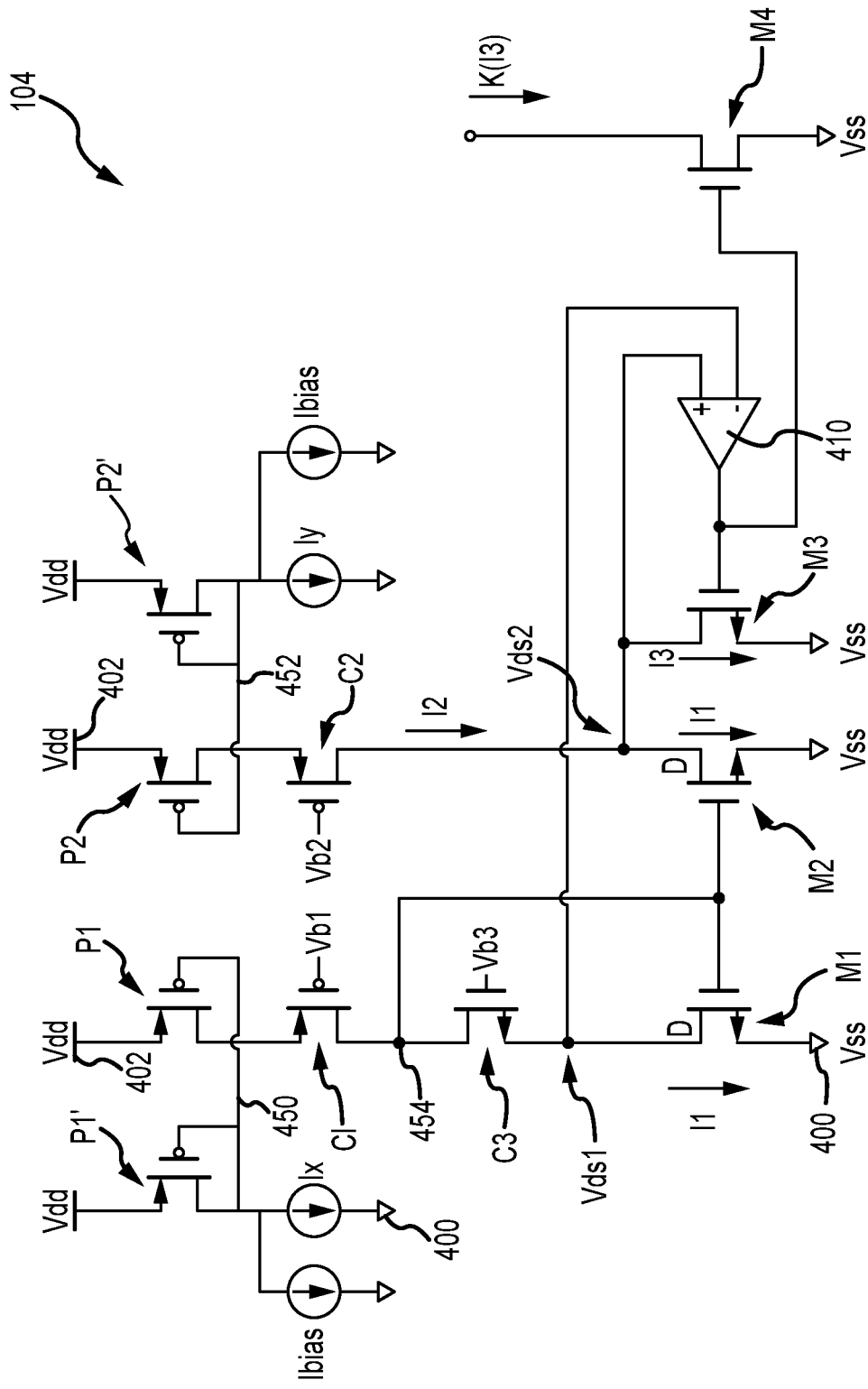
FIG. 4 is a circuit diagram showing one suitable implementation of the current subtraction circuit shown in FIG. 3 in accordance with an embodiment.

FIG. 4 is a circuit diagram showing one suitable implementation of current subtraction circuit 104. Current Ix may represent a first measured current signal, whereas current Iy may represent a second measured current signal. Current signals Ix and Iy may be sampled and held using circuitry 302 (FIG. 3). Bias current amount Ibias may separately be added to signals Ix and Iy in case Ix and Iy are too small on their own. The sum of Ix and Ibias flows through p-channel transistor P1', whereas the sum of Iy and Ibias flows through p-channel transistor P2'. Power supply line 402 represents a positive power supply terminal on which positive power supply voltage Vdd is provided, whereas power supply line 400 represents a ground power supply terminal on which ground voltage Vss is provided.

The amount of current flowing through transistor P1' is mirrored to p-channel transistor P1 via gate connection path 450. The p-channel transistors may be p-type metal-oxide-semiconducting (PMOS) transistors (as an example). P-channel transistors may sometimes be referred to as pullup transistors. If the size of transistors P1 and P1' are the same, the amount of current flowing through P1 will also be equal to (Ix+Ibias), which is denoted as current I1. This need not be the case. If desired, the size of transistors P1 and P1' can have different sizes. For the sake of clarity and simplicity, however, this disclosure assumes that P1 and P1' are identically size.

Similarly, the amount of current flowing through transistor P2' is mirror to p-channel transistor P2 via gate connection path 452. If the size of transistors P2 and P2' are the same, the amount of current flowing through P2 will also be equal to (Iy+Ibias), which is denoted as current I2. This need not be the case. If desired, the size of transistors P2 and P2' can have different sizes. For the sake of clarity and simplicity, however, this disclosure assumes that P2 and P2' are identically size.

P-channel transistor C1 may be optionally connected in series with transistor P1 and may be biased using bias voltage Vb1 at its gate. Configured in this way, transistor C1 serves as a cascode transistor, which increases the output impedance of this current path and helps keep current I1 more constant even when voltage varies. Similarly, p-channel transistor C2 may be optionally connected in series with transistor P2 and may be biased using bias voltage Vb2 at its gate. Configured in this way, transistor C2 serves as a cascode transistor, which increases the output impedance of this current path and helps keep current I2 more constant even when voltage varies.

N-channel transistors C3 and M1 may be coupled in series with transistors P1 and C1. The n-channel transistors may be n-type metal-oxide-semiconducting (NMOS) transistors (as an example). N-channel transistors are sometimes referred to as pulldown transistors. Current I1 will flow through transistors C3 and M1. Transistor C3 has a gate terminal that receives bias voltage Vb3 and is also an optional cascode transistor. Transistor M1 has a gate terminal that is connected to the drain terminal 454 of transistor C3. The series connection from transistor P1 to transistor M1 through which current I1 flows is sometimes referred to herein as a first current branch. The series connection from transistor P2 to transistor C2 through which current I2 flows is sometimes referred to herein as a second current branch.

N-channel transistor M2 may be coupled in series with transistors P2 and C2. N-channel transistor M3 may be coupled in parallel with transistor M2. Configured in this way, the second current brand splits into a first sub-branch (i.e., M2) and a second sub-branch (i.e., M3), so the total current flowing through both transistors M2 and M3 will be equal to current I2, as governed by Kirchhoff's current law. In particular, transistor M2 may have a gate terminal that is shorted to the gate terminal of transistor M1. Transistors M1 and M2 should also be identically sized (i.e., transistors M1 and M2 exhibit the same transistor dimensions).

In particular, an amplifier circuit such as amplifier 410 (e.g., an operational amplifier) may have a first (negative) input that is coupled to the drain (D) terminal of transistor M1, a second (positive) input that is coupled to the drain (D) terminal of transistor M2, and an output that is coupled to the gate terminal of transistor M3. Connected in this way, amplifier 410 will adjust the gate voltage of transistor M3 until its input terminals have matching voltages. In other words, amplifier 410 will force the drain-to-source voltage Vds1 of transistor M1 to be equal to the drain-to-source voltage Vds2 of transistor M2.

By shorting the gate terminals of transistors M1 and M2, sizing transistors M1 and M2 to be identical, and forcing Vds1 to be equal to Vds2 using amplifier 410, the currently flowing through transistor M2 will precisely mirror the amount of current flowing through transistor M1. In other words, the use of amplifier 410 to force Vds1 to be equal to Vds2 ensures that the current mirroring between transistors M1 and M2 is accurate (i.e., that the amount of current flowing through each of transistors M1 and M2 is equal to I1).

As shown in the example of FIG. 3, the amount of current flowing through transistor P2 is equal to I2. If the amount of current flowing through transistor M2 is forced to I1, then the current I3 flowing through transistor M3 will be equal to the difference between I2 and I1 (i.e., I3=I2−I1). Since I1=(Ix+Ibias) and since I2=(Iy+Ibias), I2 minus I1 will be equal to Iy−Ix, which is the desired current subtraction output.

Since the subtracted current I3 may be small, it may be desirable to amplify this current. N-channel transistor M4 may have a gate terminal that is shorted to the gate of transistor M3. To provide amplification (or current gain), transistor M4 may be sized larger relative to transistor M3. As an example, transistor M4 may have a width that is two times greater than the width of transistor M3, which will mirror an output current of 2*I3 through transistor M4. As another example, transistor M4 may have a width that is ten times greater than the width of transistor M3, which will mirror an output current of 10*I3 through transistor M4. In general, the amount of current flowing through transistor M4 may be equal to K*I3, where K represents the amount of current gain and is equal to the ratio of the width of transistor M4 to the width of transistor M3 (assuming gate lengths are equal).

The example of FIG. 4 in which the current subtraction occurs in the pulldown sub-branches is merely illustrative. In another suitable embodiment, the circuit implementation of FIG. 4 can be flipped (i.e., all the n-channel transistors will be moved to the pullup paths and be implemented using p-channel transistors, whereas all the p-channel transistors will be moved to the pulldown paths and be implemented using n-channel transistors. In other words, the current subtraction can also occur in the pullup sub-branches.

Figure 5:
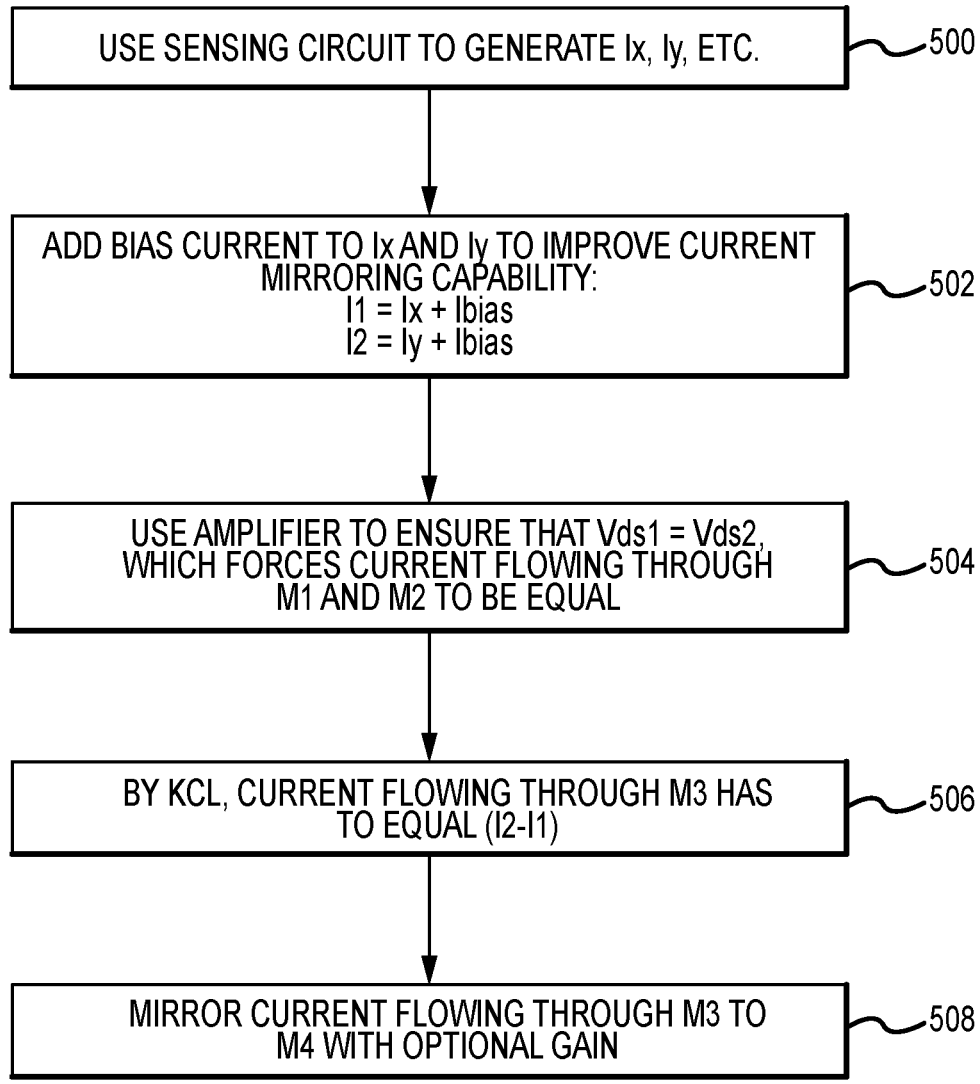
FIG. 5 is a flow chart of illustrative steps for operating a current subtraction circuit of the type shown in FIGS. 1-4 in accordance with an embodiment.

FIG. 5 is a flow chart of illustrative steps for operating current subtraction circuit 104. At step 500, a sensing circuit (e.g., circuit 102 of FIG. 1) may be used to generate current signals Ix and Iy. Signals Ix and Iy may be captured and held temporarily using sample and hold circuitry.

At step 502, bias current may be added to signals Ix and Iy to help improve current mirroring capability. For example, adding Ibias to Ix will yield I1 flowing through transistor P1', whereas adding Ibias to Iy will yield I2 flowing through transistor P2'. Current I1 will be mirrored to transistor P1 via path 450, whereas current I2 will be mirrored to transistor P2 via path 452. In other words, the amount of current flowing through transistors P1 and P2 will be set to I1 and I2, respectively.

At step 504, amplifier 410 may ensure that Vds1 is equal to Vds2, which forces the current flowing through transistors M1 and M2 to be equal. Since current I1 has to flow into transistor M1, the amount of current mirrored onto transistor M2 is also equal to I1. By Kirchhoff's current law (KCL), the current flowing through transistor M3 has to be equal to I2 subtracted by I1 (step 506).

At step 508, the amount of current flowing through transistor M3 can be mirrored to transistor M4 with an optional gain of K, where K may be at least 1, at least 2, more than 3, more than 4, more than 10, more than 100, etc.

The foregoing is merely illustrative of the principles of this invention and various modifications can be made by those skilled in the art without departing from the scope and spirit of the invention. The foregoing embodiments may be implemented individually or in any combination.

What is claimed is:

1. Circuitry, comprising:
a first current branch configured to convey a first current amount;
a second current branch configured to convey a second current amount, wherein the second current branch splits into first and second sub-branches; and
an amplifier circuit configured to force the first current amount through the first sub-branch such that the amount of current flowing through the first sub-branch is equal to the first current amount and such that the second sub-branch conveys an amount of current that is equal to the difference between the first and second current amounts, wherein the second sub-branch comprises a first transistor of a first channel type, wherein the first current branch comprises a second transistor of the first channel type, wherein the first sub-branch comprises a third transistor of the first channel type, wherein the third and first transistors are connected in parallel, and wherein the sum of the current flowing through the third and first transistors is equal to the second current amount.

2. The circuitry of claim 1, wherein the first transistor has a gate terminal, and wherein the amplifier circuit has an output that is connected to the gate terminal of the first transistor.

3. The circuitry of claim 2, wherein the second transistor has a gate terminal, and wherein the third transistor has a gate terminal that is connected to the gate terminal of the second transistor.

4. The circuitry of claim 3, wherein the second and third transistors are identically sized.

5. The circuitry of claim 3, wherein the second and third transistors each have a drain terminal, and wherein the amplifier circuit has a first input connected to the drain terminal of the second transistor and a second input connected to the drain terminal of the third transistor.

6. The circuitry of claim 1, wherein the first current branch further comprises a fourth transistor of a second channel type connected in series with the second transistor, wherein the second current branch further comprises a fifth transistor of the second channel type connected in series with the third transistor, and wherein the second channel type is different than the first channel type.

7. The circuitry of claim 6, wherein the first channel type is either an n-type channel or a p-type channel.

8. The circuitry of claim 1, wherein the first current amount is equal to the sum of a first measured current amount and a bias current amount, and wherein the second current amount is equal to the sum of a second measured current amount and the bias current amount.

9. The circuitry of claim 1, further comprising:
an output current branch configured to mirror the amount of current flowing through the second sub-branch.

10. The circuitry of claim 9, wherein the output current branch comprises a second transistor that is bigger than the first transistor to provide a predetermined current gain.

11. A method of operating current subtraction circuitry, the method comprising:
conveying a first amount of current through a first current branch;
conveying a second amount of current through a second current branch, wherein the second current branch splits into first and second current sub-branches, wherein the second current sub-branch comprises a first transistor having a gate terminal, wherein the first current branch comprises a second transistor having a first drain terminal and a third transistor having a second drain terminal;
using an amplifier to mirror the first amount of current onto the first current sub-branch and to output signals to the gate terminal of the first transistor;
receiving a first voltage from the first drain terminal at a first input of the amplifier;
receiving a second voltage from the second drain terminal at a second input of the amplifier;
conveying an amount of current that is equal to the difference between the first and second amounts of current through the second current sub-branch; and
with a fourth transistor, conveying an output current that is equal to K times the amount of current flowing through the first transistor, wherein K is greater than one.

12. An electronic device, comprising:
a proximity sensor configured to output a first current measurement and a second current measurement; and
a current subtraction circuit configure to receive the first current measurement and the second current measurement from the sensing circuit, wherein the current subtraction circuit comprises:
a first current branch, wherein the first current measurement is mirrored onto the first current branch, and wherein the first current branch includes a first transistor;
a second current branch, wherein the second current measurement is mirrored onto the second current branch, wherein the second current branch splits into a first current path and a second current path, wherein the first current path includes a second transistor, and wherein the second current path includes a third transistor; and
an amplifier configured to ensure that the amount of current flowing through the first current branch is equal to the amount of current flowing through the first current path so that the amount of current flowing through the second current path is equal to the difference between the first and second current measurements, wherein the amplifier has a first input connected to a drain terminal of the first transistor, a second input connected to a drain terminal of the second transistor, and an output that controls a gate terminal of the third transistor.

13. The electronic device of claim 12, further comprising:
a light source, wherein the first current measurement is obtained when the light source is off, and wherein the second current measurement is obtained when the light source is on.

14. The electronic device of claim 12, wherein the first current measurement mirrored onto the first current branch includes a bias current, and wherein the second current measurement mirrored onto the second current branch also includes the bias current.

* * * * *